United States Patent
Osaki et al.

(10) Patent No.: US 10,743,451 B2
(45) Date of Patent: Aug. 11, 2020

(54) ELECTRONIC COMPONENT SUPPLY DEVICE

(71) Applicant: FUJI CORPORATION, Chiryu-shi (JP)

(72) Inventors: Satoshi Osaki, Nagoya (JP); Yoshiyuki Fukaya, Chiryu (JP); Hideaki Oki, Anjyo (JP); Junro Takakuwa, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 16/310,293

(22) PCT Filed: Jul. 4, 2016

(86) PCT No.: PCT/JP2016/069771
§ 371 (c)(1),
(2) Date: Dec. 14, 2018

(87) PCT Pub. No.: WO2018/008059
PCT Pub. Date: Jan. 11, 2018

(65) Prior Publication Data
US 2019/0261543 A1    Aug. 22, 2019

(51) Int. Cl.
*G06F 9/44* (2018.01)
*H05K 13/04* (2006.01)
(Continued)

(52) U.S. Cl.
CPC .......... *H05K 13/089* (2018.08); *G06F 8/654* (2018.02); *H05K 13/02* (2013.01);
(Continued)

(58) Field of Classification Search
CPC ...... G06F 8/65; G06F 13/102; G06F 3/04886; G06F 8/654; H05K 13/0452;
(Continued)

(56) References Cited

U.S. PATENT DOCUMENTS 5,930,140 A * 7/1999 Asai ................ H05K 13/02
700/121
6,027,019 A * 2/2000 Kou ................ H05K 13/0452
235/375

(Continued)

FOREIGN PATENT DOCUMENTS

JP   2010-182768 A   8/2010
JP   2011-233796 A   11/2011
(Continued)

OTHER PUBLICATIONS

Xiaofeng Wang et al., CIM Extension to Electrical Distribution and CIM XML for the IEEE Radial Test Feeders, Aug. 2003, [Retrieved on Apr. 24, 2020]. Retrieved from the internet: <URL: https://ieeexplore.ieee.org/stamp/stamp.jsp?arnumber=1216142> 8 Pages (1021-1028) (Year: 2003).*

(Continued)

*Primary Examiner* — Anibal Rivera
(74) *Attorney, Agent, or Firm* — Oblon, McClelland, Maier & Neustadt, L.L.P.

(57) ABSTRACT

Electronic component supply device of the present invention includes multiple feeders each having an individual control section configured to operate by use of operation software to control a tape feeding mechanism, a host control section capable of holding update software configured to be replaced with at least part of the operation software, and multiple information transmission sections connected between the host control section and the individual control sections of the multiple feeders so as to transmit information and configured to transmit the update software from the host control section to the individual control sections independently of one another. According to this configuration, the multiple information transmission sections can transmit the update software to the different feeders in parallel in terms of time, whereby the updating time can be shortened sig-
(Continued)

nificantly compared with a case where update software is transmitted sequentially to multiple feeders.

7 Claims, 6 Drawing Sheets

(51) Int. Cl.
    *H05K 13/08*     (2006.01)
    *G06F 8/654*     (2018.01)
    *H05K 13/02*     (2006.01)
(52) U.S. Cl.
    CPC ..... *H05K 13/0419* (2018.08); *H05K 13/0452* (2013.01); *H05K 13/0882* (2018.08); *H05K 13/041* (2018.08); *H05K 13/0413* (2013.01)
(58) Field of Classification Search
    CPC ............. H05K 13/089; H05K 13/0419; H05K 13/0882; H05K 13/02; H05K 13/04; H05K 13/0417; H05K 13/041; H05K 13/0413
    See application file for complete search history.

(56) References Cited

U.S. PATENT DOCUMENTS

| | | | | |
|---|---|---|---|---|
| 6,256,870 | B1* | 7/2001 | Asai | H05K 13/0417 29/740 |
| 6,778,878 | B1* | 8/2004 | Kou | H05K 13/087 700/221 |
| 7,220,095 | B2* | 5/2007 | Lyndaker | H05K 13/0419 414/810 |
| 8,712,572 | B2* | 4/2014 | Higashi | H05K 13/0452 700/121 |
| 2002/0029468 | A1* | 3/2002 | Koike | H05K 13/0413 29/832 |
| 2002/0133940 | A1* | 9/2002 | Kadomatsu | H05K 13/041 29/832 |
| 2003/0131468 | A1* | 7/2003 | Yasuda | H05K 13/0882 29/739 |
| 2003/0131498 | A1* | 7/2003 | Liang | A43B 7/12 36/55 |
| 2007/0169092 | A1* | 7/2007 | Lee | G06F 8/65 717/168 |
| 2008/0277469 | A1* | 11/2008 | Corriveau | G05B 19/4183 235/385 |
| 2011/0184548 | A1* | 7/2011 | Higashi | H05K 13/0404 700/121 |
| 2011/0302776 | A1* | 12/2011 | Kato | H05K 13/0452 29/829 |
| 2013/0041492 | A1 | 2/2013 | Kodama et al. | |
| 2013/0046402 | A1* | 2/2013 | Kodama | H05K 13/04 700/117 |
| 2013/0047392 | A1 | 2/2013 | Iwaki et al. | |
| 2013/0066440 | A1 | 3/2013 | Kodama et al. | |
| 2014/0090244 | A1* | 4/2014 | Sakamoto | H05K 13/0417 29/740 |
| 2015/0116770 | A1* | 4/2015 | Tanaka | H05K 13/0419 414/810 |
| 2016/0292090 | A1* | 10/2016 | Kim | H05K 13/087 700/221 |

FOREIGN PATENT DOCUMENTS

| | | |
|---|---|---|
| JP | 2015-18930 A | 1/2015 |
| WO | WO 2016/063363 A1 | 4/2016 |

OTHER PUBLICATIONS

Yongshan Xiao et al., Dynamics Research on Tape Feeder of Placement Machine, Oct. 27, 2010, [Retrieved on Apr. 24, 2020]. Retrieved from the internet: <URL: http://citeseerx.ist.psu.edu/viewdoc/download?doi=10.1.1.1006.9825&rep=rep1&type=pdf> 4 Pages (203-204) (Year: 2010).*
International Search Report dated Sep. 27, 2016 in PCT/JP2016/069771 filed on Jul. 4, 2016.

* cited by examiner

ELECTRONIC COMPONENT SUPPLY DEVICE

TECHNICAL FIELD

The present application relates to an electronic component supply device having multiple feeders and, more particularly, to a configuration configured to update software for operation of each feeder.

BACKGROUND ART

Equipment for producing a board on which a large number of electronic components are mounted includes a solder printing machine, an electronic component mounter, a reflow machine, aboard inspection machine, and the like. It is common to configure a board production line by connecting the equipment described above. In the equipment described above, the electronic component mounter includes a board conveyance device, an electronic component supply device, a component transfer device, and a control device. In many cases, the electronic component supply device employs a configuration in which multiple feeders are provided in an exchangeable manner. The feeder has a tape feeding mechanism configured to feed out a carrier tape holding multiple electronic components and an individual control section configured to be activated to operate by operation software to control the tape feeding mechanism.

The operation software is installed in the individual control section when the feeder is produced, and there are multiple types of operation software that differ according to specifications and production periods of feeder models. In addition, such operation software can be updated totally or partially even after the feeder has been used so as to adapt a technical improvement or the like. Update software to replace at least part of the operation software is transmitted through communication from, for example, a host control section. Patent Document 1 discloses an electronic component supply device of this type and a technical example relating to updating of operation software of feeders of the electronic component supply device.

An electronic component mounter of Patent Document 1 includes a head unit configured to collect electronic components from multiple feeders, operating based on a control program, so as to mount the collected electronic components on a board, and individual update programs for updating the control program include common program portions that can be interchangeably used with one another, the individual update programs being configured to be transmitted to the corresponding feeders in parallel. According to this, when compared with a case where all of the update programs are transmitted to the feeders individually and sequentially, it is understood that the communication time can be shortened to such an extent that the common programs are transmitted to the corresponding feeders in parallel.

PRIOR ART LITERATURE

Patent Literature 1: JP-A-2010-182768

BRIEF SUMMARY

Technical Problem

Incidentally, in the technical example of Patent Document 1, the specific program portions of the individual update programs which exclude the common program portions are still transmitted sequentially to the corresponding feeders. Therefore, the effect of shortening the communication time is limited, and the update time required to update the programs of the feeders is not significantly shortened.

In addition, in the configuration in which the operation software is transmitted from the host control section to the individual feeders through communication, a new type of feeder also needs to use the conventional slow communication speed to ensure the consistency and compatibility with the conventional feeder produced in the past. On the other hand, the processing speeds of the host control section and the individual control sections progress rapidly and are superior to the slow conventional communication speeds. As a result, a remarkable time loss is produced while the host control section and the individual control sections are waiting for the end of a communication, whereby the operation of the electronic component mounter is interrupted during the update time which is summation of the long communication time required for each individual feeder.

The present disclosure has been made in view of the problem inherent in the background art described above, and the present disclosure solves the technical problem by providing an electronic component supply device which can reduce remarkably an update time necessary to replace operation software for multiple feeders with update software.

Solution to Problem

With a view to solving the problem, according to the present disclosure, there is provided an electronic component supply device including: multiple feeders, each having a tape feeding mechanism configured to feed out a carrier tape, holding multiple electronic components, and an individual control section configured to operate by use of operation software to control the tape feeding mechanism to thereby supply sequentially an electronic component to its own feeding position; a host control section capable of holding update software to be replaced with at least part of the operation software; and multiple information transmission sections, being connected between the upper control section and the individual control sections of the multiple feeders, so as to transmit information and configured to transmit the update software from the host control section to the individual control sections independently of one another.

Advantageous Effect

Since the electronic component supply device of the present disclosure includes the multiple information transmission sections, configured to perform a transmission independently of one another, between the host control section and the multiple individual control sections, the update software being transmitted to the different feeders in parallel in terms of time. Therefore, compared with the related art in which the update software is sequentially transmitted to the multiple feeders, the updating time can be significantly shortened in refection of the update software being transmitted to the different feeders in parallel.

DESCRIPTION OF EMBODIMENTS (1. Overall Configuration of Electronic Component Mounter 1)

Figure 1:
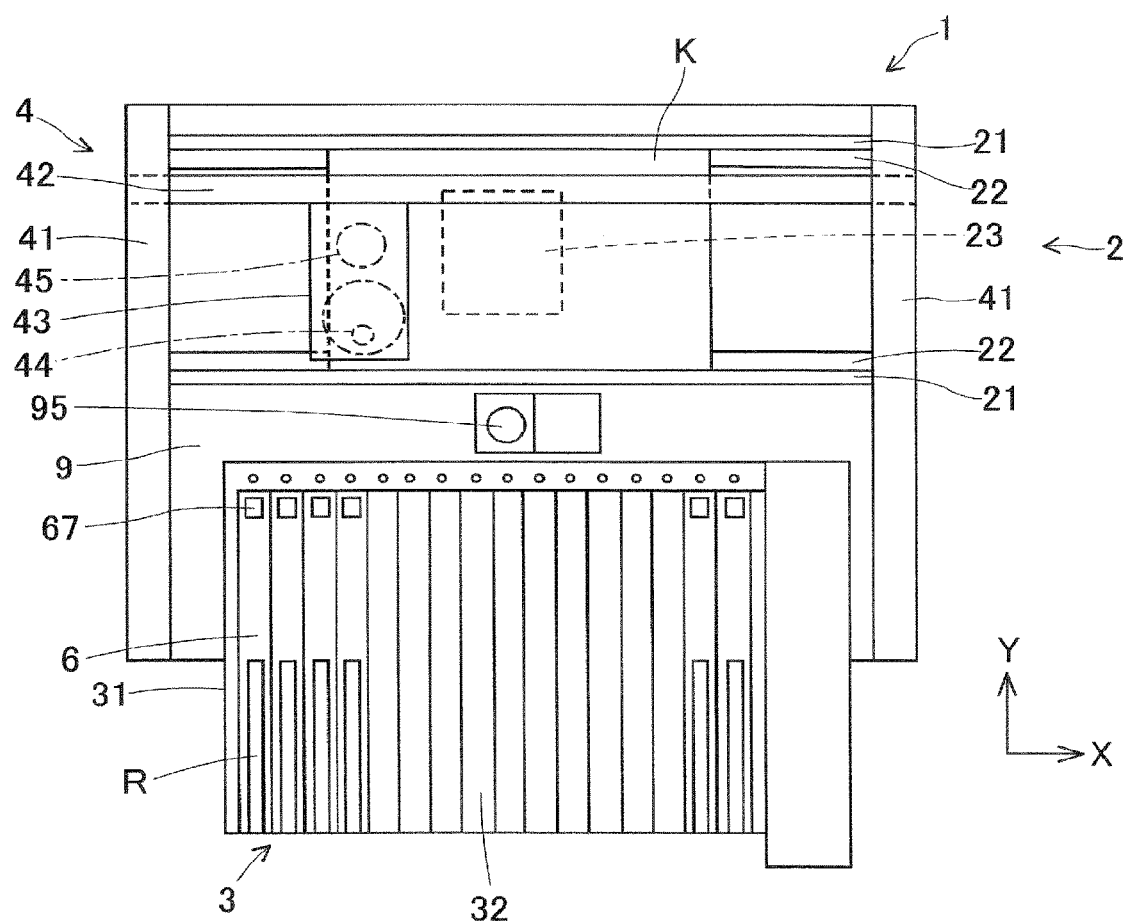
FIG. 1 is a plan view schematically showing an overall configuration of an electronic component mounter on which an electronic component supply device of a first embodiment is mounted.

Electronic component supply device 3 of a first embodiment of the present disclosure will be described with reference to FIGS. 1 to 4. First, an overall configuration of electronic component mounter 1 on which electronic component supply device 3 is mounted will be described. FIG. 1 is a plan view schematically showing the overall configuration of electronic component mounter 1 on which the electronic component supply device 3 of the first embodiment is mounted. A direction from a left side to a right side of FIG. 1 is an X direction in which board K is conveyed in and out, and a vertical direction of a sheet of paper on which FIG. 1 is drawn is a Y direction. As shown in the figure, electronic component mounter 1 includes a board conveyance device 2, the electronic component supply device 3, a component transfer device 4 and a control device 7 (shown in FIG. 3).

Board conveyance device 2 is provided on an upper surface of a mounter base 9 and conveys board K in the X direction to place board K in a mounting execution position. Board conveyance device 2 is made up of a pair of guide rails 21, a pair of conveyor belts 22, a clamp unit 23, and the like. The pair of guide rails 21 extend in the X direction and are arranged in parallel to each other. The pair of conveyor belts 22, each having an annular shape on which board K can be mounted, are provided inside guide rails 21, with facing each other in rotatable manner. Clamp unit 23 is provided below the mounting execution position which is set about at a center between guide rails 21 in the X direction. Board K is conveyed in and out by conveyor belts 22 while being guided by guide rails 21 and is positioned in the mounting execution position to be fixed in place by clamp unit 23.

Electronic component supply device 3 is made up mainly of pallet member 31 having a substantially rectangular shape as a main member. Multiple slots 32 are formed on an upper surface of pallet member 31 so as to be aligned in the X direction while extending in the Y direction. The electronic component supply device 3 installs multiple feeders 6 individually in multiple slots 32 in an exchangeable manner. Electronic component supply device 3 has host control section 51, configured to control feeders 6 installed, in an interior of pallet member 31 (shown in FIG. 3).

Feeder 6 holds reel R at a rear side in an exchangeable manner and has component supply position 67 at a front upper portion. In the example of FIG. 1, pallet member 31 includes 16 slots 32. Then, feeders 6 are installed individually in six slots 32 in total, that is, in two consecutive right-hand side slots and four consecutive left-hand side slots on pallet member 31. In many cases, pallet member 31 of electronic component supply device 3 includes far more slots 32.

Component transfer device 4 is made up of a pair of fixed rails 41, head moving rail 42, mounting head 43, suction nozzle 44, board recognition camera 45, and the like. Fixed rails 41 extend in the Y direction above board conveyance device 2 and are arranged parallel to each other. Head moving rail 42 extends in the X direction and is supported movably on the fixed rails 41 at both ends thereof. Head moving rail 42 is driven in the Y direction by a ball screw feeding mechanism, not shown. Mounting head 43 is supported movably on head moving rail 42. Mounting head 43 is driven in the X direction by a ball screw feeding mechanism, not shown. Mounting head 43 has suction nozzle 44 and board recognition camera 45 which are oriented downwards. Suction nozzle 44 collects an electronic component through suction from feeder 6 and mounts the electronic component on board K positioned in place. Board recognition camera 45 recognizes an accurate coordinate position of board K positioned in place.

Component recognition camera 95 is provided between board conveyance device 2 and electronic component supply device 3. Component recognition camera 95 captures an image of a picked up state of an electronic component collected by suction nozzle 44 from below the electronic component and recognizes the picked up state. Control device 7 controls the board conveyance device 2, the electronic component supply device 3 and the component transfer device 4 in a cooperative manner to operate electronic component mounter 1 smoothly.

(2. Configurations of Electronic Component Supply Device 3 and Feeder 6 of First Embodiment)

Figure 2:
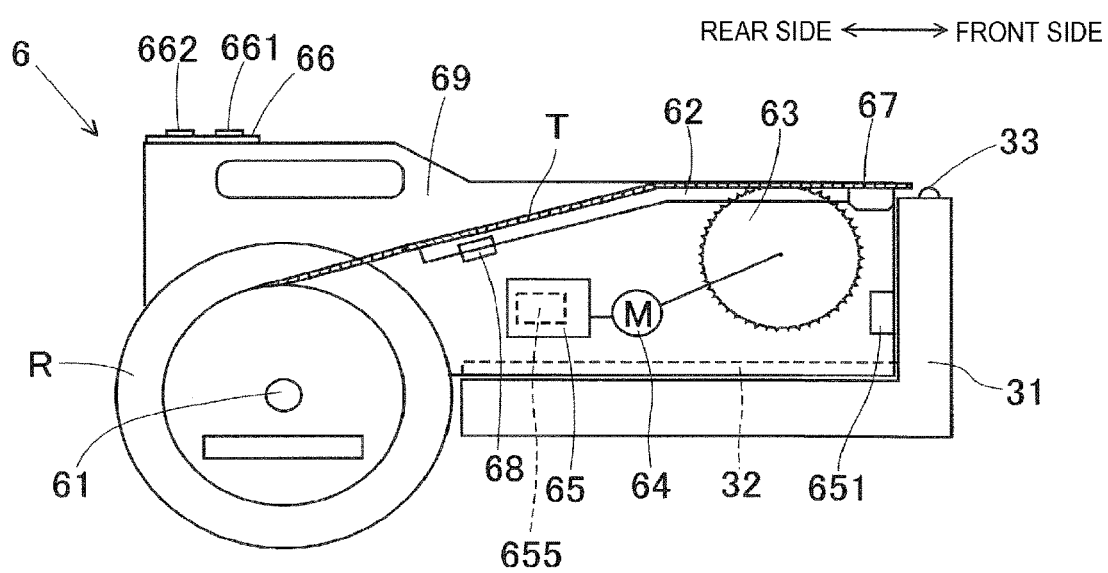
FIG. 2 is a side view schematically showing a configuration example of a feeder installed in the electronic component supply device in an exchangeable manner.

FIG. 2 is a side view showing schematically a configuration example of feeder 6 installed in the electronic component supply device 3 in an exchangeable manner. Feeder 6 is made up by attaching reel holding shaft 61, tape guide member 62, sprocket 63, drive motor 64, individual control section 65, operation panel 66, tape detection sensor 68, and the like to side panel 69. Reel holding shaft 61 is provided closer to a rear bottom portion of side panel 69. Reel holding shaft 61 holds reel R around which carrier tape T holding electronic components is wound in an exchangeable manner.

Tape guide member 62 extends obliquely upwards to the front from a front side of reel R held on reel holding shaft 61 and then extends horizontally to the front after tape guide member 62 reaches an upper edge of side panel 69. Tape guide member 62 guides carrier tape T fed out of reel R towards component supply position 67 at a front upper portion. Sprocket 63 is supported rotatably on a lower side of a frontward portion of tape guide member 62. Teeth on an outer circumference of sprocket 63 are in mesh engagement with sprocket holes in carrier tape T. Drive motor 64 can drive to rotate sprocket 63 in either of a forward direction and a reverse direction. Drive motor 64 is controlled by individual control section 65. Sprocket 63 and drive motor 64 make up a tape feeding mechanism.

Operation panel 66 is provided at a rearward portion on an upper surface of side panel 69. Operation panel 66 has feed-out switch 661 and rewind switch 662. Feed-out switch 661 and rewind switch 662 are manual switches operated by an operator, and their operating statuses are transmitted to individual control section 65. When feed-out switch 661 or rewind switch 662 is depressed, individual control section 65 drives motor 64 and sprocket 63 intermittently forwards or reversely. This enables carrier tape T to be fed out or rewound by a small amount. Tape detection sensor 68 is positioned at a rearward inclined portion of tape guide member 62. Tape detection sensor 68 detects a presence of carrier tape T that is fed out and sends the results of the detection to individual control section 65.

Individual control section 65 is a computer device having a CPU. Individual control section 65 is connected to host control section 51 for communication via connector 651 provided on a front surface (which will be described in detail later). Individual control section 65 stores an ID code of feeder 6 configured to identify feeder 6 and information on the model type of feeder 6 in an internal memory thereof. The ID code and information on the model type of feeder 6 are transmitted from individual control section 65 to host control section 51 at a point in time when feeder 6 is installed in corresponding slot 32.

In addition, individual control section 65 stores operation software 655 in the internal memory. Operation software 655 is made up, for example, of an operation program and constant data. Specifically, operation software 655 describes details of a controlling operation of controlling drive motor 64 based on a command from host control section 51 while taking into consideration an operating status of control panel 66 and the result of the detection by tape detection sensor 68.

At least part of operation software 655 can be replaced with update software to match an improved technology and an enhanced performance of feeder 6. The replacement of the operation software with the update software is executed normally at an interval between operations of electronic component mounter 1. Examples of the improved technology and the enhanced performance of feeder 6 include an improved feeding performance of carrier tape T, an improved accuracy with which an electronic component is placed in component supply position 67, an enhanced responsiveness of operation panel 66 when it is operated, and the like.

Figure 3:
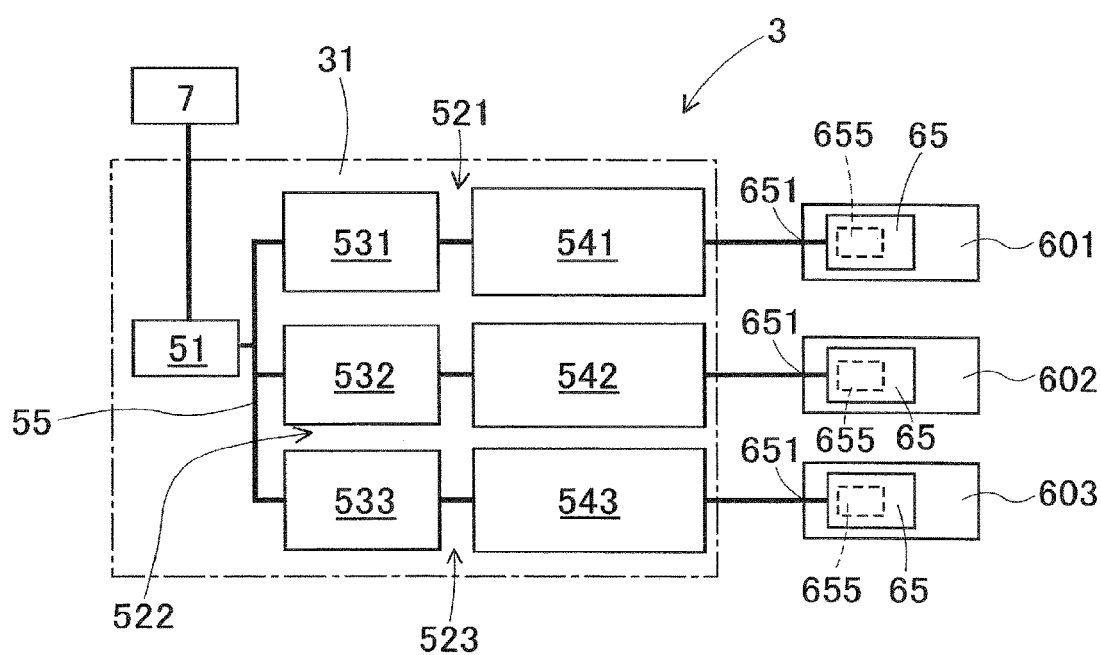
FIG. 3 is a functional block diagram of a portion of the electronic component supply device configured to transmit update software.
Figure 4:
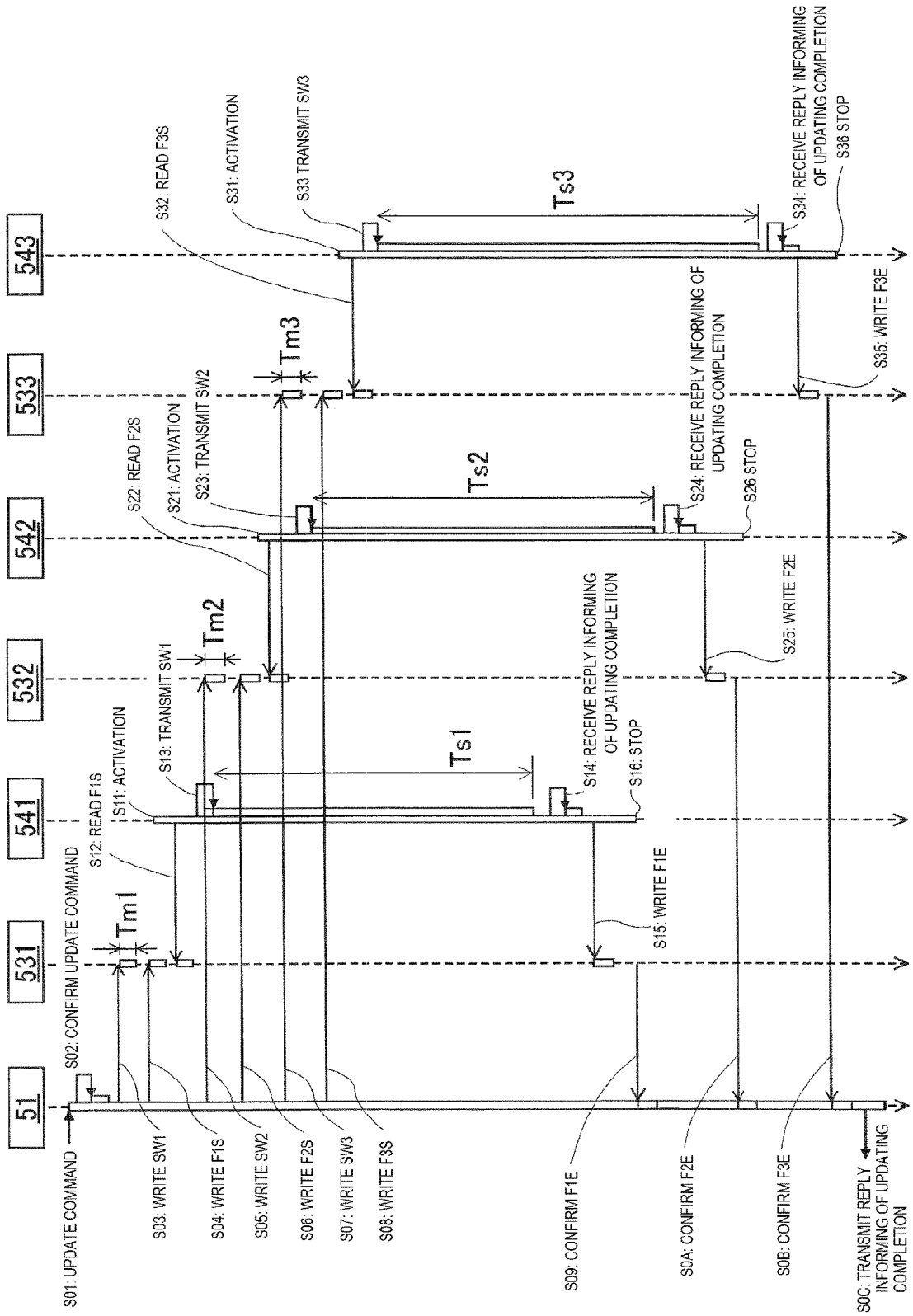
FIG. 4 is a time chart schematically showing an operation of the electronic component supply device.
Figure 5:
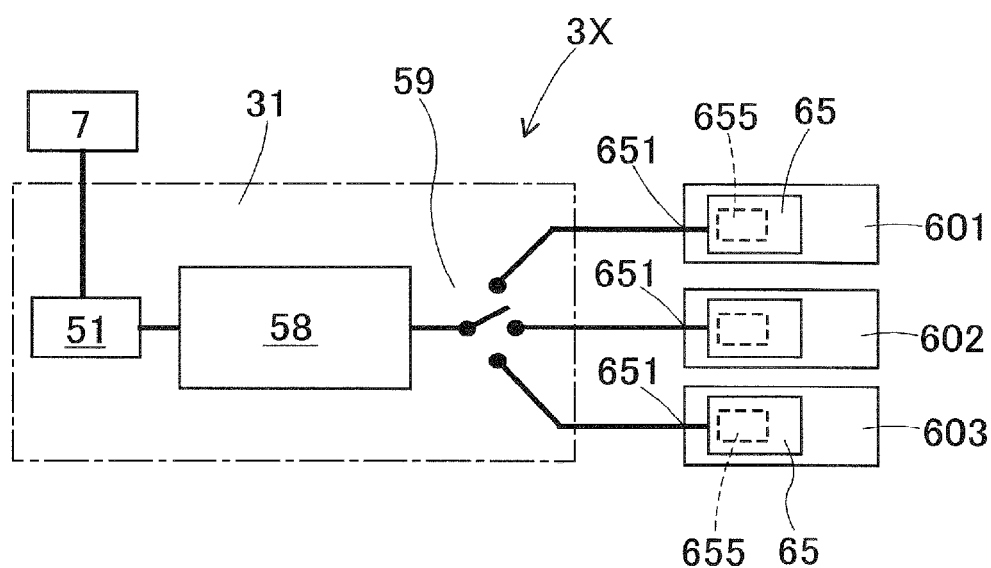
FIG. 5 is a functional block diagram of a portion of an electronic component supply device of a comparison example configured to transmit update software.

FIG. 3 is a functional block diagram of a portion of electronic component supply device 3 configured to transmit update software. In FIGS. 3 to 5, feeder 6 is simplified into three feeders of first feeder 601, second feeder 602, and third feeder 603. As shown in FIG. 3, host control section 51, first information transmission section 521, second information transmission section 522, and third information transmission section 523 are provided in an interior of pallet member 31. Host control section 51 receives and stores a command from control device 7. One type of command is a software update command. The software update command includes, in addition to data of update software, an ID code of target feeder 6 for updating and information on a model type thereof.

Three information transmission sections 521, 522, 523 have the same configuration and are provided for feeders 601, 602, 603, respectively, in a one-to-one manner. First information transmission section 521 includes first memory 531 and first communicating function circuit 541. Similarly, second information transmission section 522 includes second memory 532 and second communicating function circuit 542, and third information transmission section 523 includes third memory 533 and third communicating function circuit 543. Three information transmission sections 521, 522, 523 operate independently of one another.

Memories 531, 532, 533 are connected to host control section 51 via bus 55. An address bus and a 16-bit parallel data bus can be exemplified as bus 55, but the present disclosure is not limited to them. Host control section 51 has a function of writing data such as various commands and update software into memories 531, 532, 533 via bus 55. Further, host control section 51 has a function of reading data out of memories 531, 532, 533 via bus 55.

Three communication function circuits 541, 542, 543 are connected to memories 531, 532, 533, respectively. Communication function circuits 541, 542, 543 have a function of reading data out of memories 531, 532, 533, respectively, and can read data in 16-bit parallel, for example. Further, communication function circuits 541, 542, 543 have a function of writing data into memories 531, 532, 533, respectively.

First communication function circuit 541 is connected to individual control section 65 by way of connector 651 of first feeder 601 installed for communication. Similarly, second communication function circuit 542 is connected to individual control section 65 byway of connector 651 of second feeder 602 installed for communication, and third communication function circuit 543 is connected to individual control section 65 by way of connector 651 of third feeder 603 installed for communication. Communication function circuits 541, 542, 543 have functions of performing a parallel-serial conversion on update software read out of corresponding memories 531, 532, 533, and transmitting the update software to corresponding control sections 65 in a serial system. Communication function circuits 541, 542, 543 each have a function of receiving a reply from corresponding individual control sections 65.

(3. Operation and Function of Electronic Component Supply Device 3 of the First Embodiment)

Next, an operation and function of electronic component supply device 3 of the first embodiment will be described. FIG. 4 is a time chart schematically showing an operation of electronic component supply device 3. In FIG. 4, upper control unit 51, first memory 531, first communication function circuit 541, second memory 532, second communication function circuit 542, third memory 533, and third communication function circuit 543 are arranged in that order from a left side to a right side of the figure. Also, time elapses from a top to a bottom in FIG. 4; however, a time scale is not exact.

In step S 01 of FIG. 4, upper control section 51 receives a software update command from control device 7. By doing so, host control section 51 starts an updating control of operation software 655 of feeders 6. In step S 02, upper control section 51 confirms details of the update command. Firstly, host control section 51 compares a data length of update software SW1 for first feeder 601 with a memory capacity of first memory 531. Similarly, host control section 51 compares a data length of update software SW2 for second feeder 602 with a memory capacity of second memory 532, and compares a data length of update software SW3 for third feeder 603 with a memory capacity of third memory 533. When the data lengths are smaller than the memory capacities, host control section 51 determines to transmit update software SW1, SW2, SW3 wholly through a single transmission. On the other hand, when the data lengths are larger than the memory capacities, host control section 51 determines to divide the update software SW1, SW2, SW3 into multiple packets and transmit the update software SW1, SW2, SW3 packet by packet through multiple actions.

Host control section 51 confirms target feeder 6 for updating. In the example of FIG. 4, three update targets are a first feeder 601, a second feeder 602, and a third feeder 603. Therefore, host control section 51 writes update software SW1 in first memory 531, next, writes update software SW2 in second memory 532, and finally writes update software SW3 in third memory 533. This enables three communication function circuits 541, 542, 543 to operate in parallel in terms of time. Three update software SW1, SW2, SW3 may be the same or different from one another. The operation of electric component supply device 3 will be described in detail below.

In step S 03, host control section 51 writes update software SW1 for first feeder 601 in first memory 531. When update software SW1 is divided into multiple packets, host control section 51 writes a first packet of update software SW1 for first feeder 601 in first memory 531. Writing time Tm1 becomes short since the writing is executed via bus 55. In step S 04 after the writing is completed, host control section 51 writes a communication start flag F1S in first memory 531. The communication start flag F1S is a flag for issuing a command to start a transmission to first communication function circuit 541.

On the other hand, first communication function circuit 541 is controlled to be activated by host control section 51 in step S11. In step S 12, first communication function circuit 541 reads the communication start flag F1S out of first memory 531. In step S 13 after communication start flag F1S is read out, first communication function circuit 541 transmits update software SW1 or the first packet thereof to individual control section 65 of first feeder 601. Since the serial system is used for communication, transmission time Ts1 becomes longer than reading time Tm1. After completing the transmission, first communication function circuit 541 waits for a reply from first feeder 601.

Individual control section 65 of first feeder 601 replaces at least part of operation software 655 with received update software SW1 or the first packet thereof to update operation software 655. When the updating is completed, individual control section 65 of first feeder 601 transmits a reply informing of the completion of updating to first communication function circuit 541. When receiving the reply informing of the completion of updating in step S14, first communication function circuit 541 writes a communication completion flag F1E in first memory 531 in step S15. In a subsequent step S 16, first communication function circuit 541 stops working.

In step S 05 after step S 04 ends, host control section 51 writes update software SW2 for second feeder 602 or a first packet thereof in second memory 532 within writing time Tm2. In step S 06 after the writing is completed, host control section 51 writes a communication start flag F2S in second memory 532. Communication start flag F2S is a flag for issuing a command to start a transmission to second communication function circuit 542.

On the other hand, second communication function circuit 542 is controlled to be activated by host control section 51 in step S21. In step S 22, second communication function circuit 542 reads communication start flag F2S out of second memory 532. In step S 23 after communication start flag F2S is read out, second communication function circuit 542 transmits update software SW2 or a first packet thereof to individual control section 65 of second feeder 602. Since update software SW2 is transmitted in a serial communication system, transmission time Ts2 is longer than writing time Tm2. After completing the transmission of update software SW2, second communication function circuit 542 waits for a reply from second feeder 602.

Here, second communication function circuit 542 starts transmission at a later timing than a timing at which first communication function circuit 541 starts transmission. Nevertheless, most of the transmission time Ts2 of second communication function circuit 542 overlaps the transmission time Ts1 of first communication function circuit 541.

Individual control section 65 of second feeder 602 replaces at least part of operation software 655 with received update software SW2 or the first packet thereof to update operation software 655. When the updating is completed, individual control section 65 of second feeder 602 transmits a reply informing of the completion of updating to second communication function circuit 542. When receiving the reply informing of the completion of updating in step S24, second communication function circuit 542 writes a communication completion flag F2E in second memory 532 in step S25. In a subsequent step S 26, second communication function circuit 542 stops working.

In step S07 after step S 06 ends, host control section 51 writes update software SW3 for third feeder 603 or a first packet thereof in third memory 533 within writing time Tm3. In step S08 after the writing is completed, host control section 51 writes a communication start flag F3S in third memory 533. Communication start flag F3S is a flag for issuing a command to start a transmission to third communication function circuit 543.

On the other hand, third communication function circuit 543 is controlled to be activated by host control section 51 in step S 31. In step S32, third communication function circuit 543 reads communication start flag F3S out of third memory 533. In step S33 after communication start flag F3S is read out, third communication function circuit 543 transmits update software SW3 or a first packet thereof to individual control section 65 of third feeder 603. Since update software SW3 is transmitted in a serial communication system, transmission time Ts3 is longer than writing time Tm3. After completing the transmission of update software SW3, third communication function circuit 543 waits for a reply from third feeder 603.

Here, third communication function circuit 543 starts transmission at a later timing than the timing at which second communication function circuit 542 starts transmission. Nevertheless, most of the transmission time Ts3 of third communication function circuit 543 overlaps the transmission time Ts1 of first communication function circuit 541 and the transmission time Ts2 of second communication function circuit 542. That is, three communication function circuits 541, 542, 543 can perform transmission in parallel in terms of time.

Individual control section 65 of third feeder 603 replaces at least part of operation software 655 with received update software SW3 or the first packet thereof to update operation software 655. When the updating is completed, individual control section 65 of third feeder 603 transmits a reply informing of the completion of updating to third communication function circuit 543. When receiving the reply informing of the completion of updating in step S34, third communication function circuit 543 writes a communication completion flag F3E in third memory 533 in step S35. In a subsequent step S 36, third communication function circuit 543 stops working.

After step S08 is completed, host control section 51 reads out the contents of memories 531, 532, 533 sequentially and confirms the presence or absence of communication completion flags F1E, F2E, F3E. In step S09, host control section 51 confirms communication completion flag F1E of first memory 531. By doing so, host control section 51 recognizes that the transmission to first feeder 601 has been completed properly. Similarly, host control section 51 confirms communication completion flag F2E of second memory 532 in step S0A and then recognizes that the transmission to second feeder 602 has been completed properly. Similarly, host control section 51 confirms communication completion flag F3E of third memory 533 in step SOB and then recognizes that the transmission to third feeder 603 has been completed properly.

When update software SW1, SW2, SW3 is transmitted through a single transmission, operation software 655 of three feeders 601, 602, 603 is updated completely at a point in time when step SOB ends. Therefore, host control section 51 sends to control device 7 a reply informing that operation software 655 of three feeders 601, 602, 603 has been updated completely by update software SW1, SW2, SW3 in step S0C.

To the contrary, when update software SW1, SW2, SW3 is transmitted multiple times in a divided manner, after step SOB ends, host control section 51 repeats the operations from the second step onwards, that is, from step S03 to step SOB with writing sequentially packets from second packet onwards in memories 531, 532, 533. Then, three communication function circuits 541, 542, 543 also repeat transmits accordingly. The number of times of repetition corresponds to the number of packets into which update software SW1, SW2, SW3 is divided. Operation software 655 of three feeders 601, 602, 603 is updated completely at a point in time when step SOB has been repeated a predetermined number of times. Therefore, the process proceeding to step S0C, host control section 51 sends to control device 7 a reply informing that operation software 655 has been updated completely by update software SW1, SW2, SW3.

Next, the function of electronic component supply device 3 of the first embodiment will be described while comparing it with an electronic component supply device of a comparison example. FIG. 5 is a functional block diagram of a portion of an electronic component supply device 3X of a comparison example configured to transmit update software. In the comparison example, host control section 51, single information transmission section 58, and selector 59 are disposed in an interior of pallet member 31. Single information transmission unit 58 transmits update software received from host control section 51 to selector 59. Selector 59 sequentially switches individual control sections 65 of feeders 601, 602, 603 to which update software is transmitted in accordance with a command from host control section 51. In the comparison example, too, information transmission section 58 transmits update software through communication by use of a serial system.

Consequently, in the comparison example, update software SW1, SW2, SW3 is transmitted sequentially to three feeders 601, 602, 603, respectively. This makes updating time necessary to update operation software 655 of three feeders 601, 602, 603 longer than a time resulting from adding up transmission times spent transmitting update software to the three corresponding feeders which is not executed in a parallel or overlapping manner in terms of time. To the contrary, in the first embodiment, three communication function circuits 541, 542, 543 transmit update software in a parallel manner in terms of time so that most portions of transmission times Ts1, Ts2, Ts3 overlap one another. As a result, the updating time is shortened to about 35 to 40% of that of the comparative example.

According to a particular estimate, writing times Tm1, Tm2, Tm3 become smaller about 3 orders in length than transmission time Ts1, Ts2, Ts3. Consequently, even in a configuration involving several tens of feeders 6 and several tens of sets of a memory and a communication function circuit, host control section 51 can write sequentially update software in several tens of memories within a shorter time than transmission times Ts1, Ts2, Ts3. This enables the updating time to be shortened remarkably when several tens of communication function circuits transmit update software in parallel in terms of time.

It is noted that host control section 51 is capable of holding multiple types of update software, which differ from one another, for multiple types of multiple feeders 6 which are installed in pallet member 31 in an exchangeable manner. Then, when feeder 6 of one of the types is installed in slot 32, host control section 51 can obtain an ID code and information on the type of feeder 6 to determine whether feeder 6 is a target feeder for updating. When determining that feeder 6 is a target feeder for updating, host control section 51 transmits update software necessary to update feeder 6 by way of an information transmission section connected to feeder 6. Consequently, the number of feeders 6 which constitute target feeders for updating coincides with a maximum number of slots 32 provided at an uppermost end and a minimum number of slot 32 provided, that is, one at a lowermost end. When the number of feeders 6 constituting target feeders for updating is only one, no updating time shortening effect is provided compared with the comparison example.

(4. Mode and Advantageous Effect of Electronic Component Supply Device 3 of First Embodiment)

Electronic component supply device 3 of the first embodiment includes the multiple feeders 601, 602, 603 each having the tape feeding mechanism (sprocket 63, drive motor 64) configured to feed out carrier tape T holding the multiple electronic components and individual control section 65 configured to operate by use of operation software 655 to control the tape feeding mechanism to thereby supply sequentially an electronic component to its own feeding position 67, host control section 51 capable of holding update software SW1, SW2, SW3 configured to be replaced with at least part of operation software 655, and multiple information transmission sections 521, 522, 523 connected between host control section 51 and individual control sections 65 of the multiple feeders 601, 602, 603 so as to transmit information and configured to transmit update software SW1, SW2, SW3 from host control section 51 to individual control sections 65 independently of one another.

According to this configuration, update software SW1, SW2, SW3 can be transmitted to different feeders 601, 602, and 603 in parallel in terms of time. Therefore, compared with the comparison example in which the update software is sequentially transmitted to multiple feeders 601, 602, 603, the updating time can be significantly shortened by such an extent that update software SW1, SW2, SW3 is transmitted 1 to different feeders 601, 602, 603 in parallel.

Further, multiple information transmission sections 521, 522, 523 have memories 531, 532, 533, respectively, in which host control section 51 writes update software SW1, SW2, SW3 via the bus 55, and communication function circuits 541, 542, 543 configured to transmit update software SW1, SW2, SW3 written in memories 531, 532, 533 to individual control sections 65.

According to this configuration, since the writing times Tm 1, Tm 2, Tm 3 during which host control section 51 writes sequentially update software SW1, SW2, SW3 in memories 531, 532, 533, respectively, become short, thereby most portions of transmission times Ts1, Ts2, Ts3 overlap, and the updating time shortening effect becomes remarkable. This effect also occurs when operation software 655 of several tens of feeders 6 is updated.

Further, communication function circuits 541, 542, 543 of multiple information transmission sections 521, 522, 523 start transmission when update software SW1, SW2, SW3 is written in memories 531, 532, and 533. According to this, since no wasteful waiting time is generated in communication function circuits 541, 542, 543, the updating time is not unnecessarily prolonged.

Further, information transmission units 521, 522, 523 are provided for multiple feeders 601, 602, 603 one for each feeder. According to this configuration, it becomes unnecessary to transmit sequentially the update software to multiple feeders 601, 602, 603 as in the comparison example, whereby the updating time can be shortened in an ensured manner.

Further, host control section 51 is capable of holding multiple types of update software SW1, SW2, SW3, which differ from one another, for multiple types of multiple feeders 6 which are installed in an exchangeable manner, and when feeder 6 of a first model type in the multiple types of multiple feeders 6 is installed, the information transmission section, among one of multiple information transmission sections 521, 522, 523, which is connected to feeder 6 of the first model type, transmits the update software corresponding to the feeder of the first model type in the multiple types of update software. According to this configuration, operation software 655 can surely be updated even for feeder 6 which is removed temporarily, and hence, no update failure occurs.

Further, update software SW1, SW2, SW3 can be divided into multiple packets so as to be transmitted packet by packet in multiple times. According to this configuration, even in the event that update software SW1, SW2, SW3 has a difference in data length, operation software 655 can be updated in an ensured manner.

(5. Electronic Component Supply Device 3A of Second Embodiment)

Figure 6:
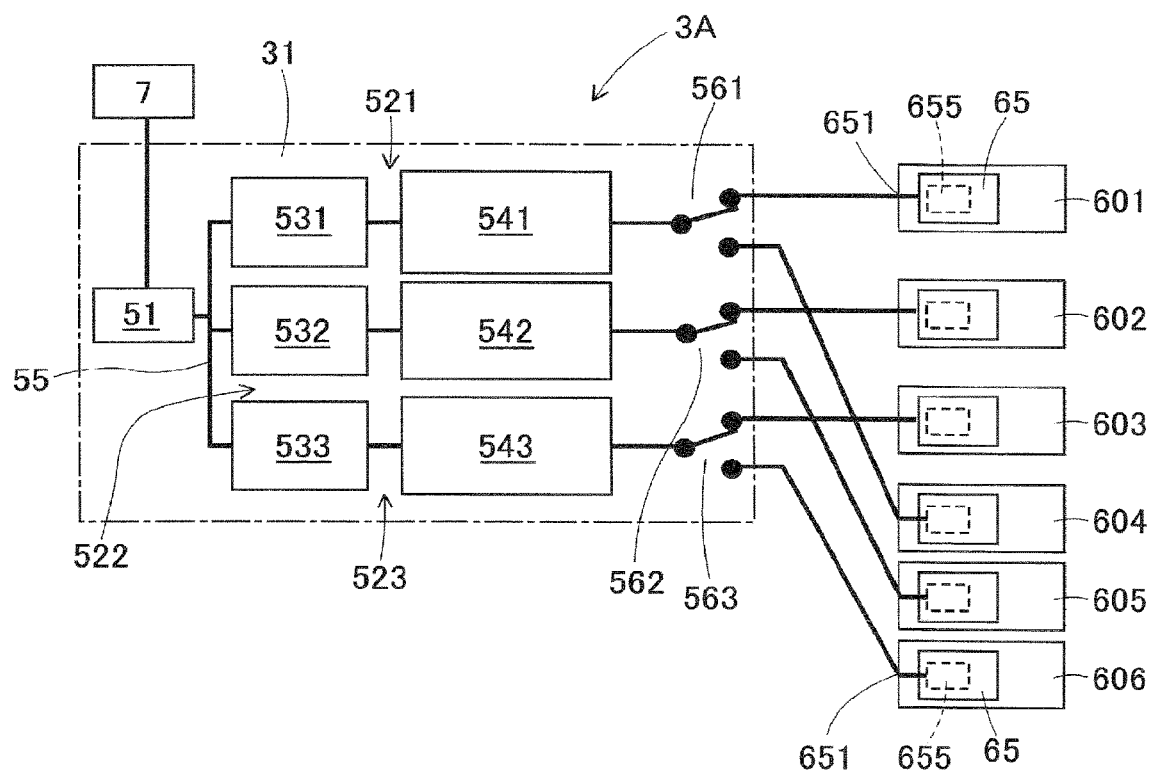
FIG. 6 is a functional block diagram of a portion of an electronic component supply device of a second embodiment configured to transmit update software.

Next, electronic component supply device 3A of a second embodiment will be described mainly on different features from the first embodiment. In the first embodiment, the updating time can be shortened significantly in an ensured manner; however, when the number of slots 32 becomes large, the circuit scale of the information transmission sections increases accordingly, resulting in an increase in cost. Due to this, in the second embodiment, the circuit scale is reduced by use of first selector 561, second selector 562, and third selector 563. FIG. 6 is a functional block diagram of a portion for transmitting the update software of the electronic component supply device 3A according to the second embodiment. In FIG. 6, the feeder 6 is simplified to six feeders, i.e., a first feeder 601, a second feeder 602, a third feeder 603, a fourth feeder 604, a fifth feeder 605, and a sixth feeder 606.

As can be seen from a comparison of FIG. 6 with FIG. 3, in the second embodiment, an input side of first selector 561 is connected to a transmission output side of first communication function circuit 541. Similarly, an input side of second selector 562 is connected to a transmit output side of second communication function circuit 542, and an input side of third selector 563 is connected to a transmission output side of third communication function circuit 543. In the second embodiment, functions other than selectors 561, 562, and 563 are substantially the same as those of the first embodiment, and therefore a detailed description thereof is omitted.

First selector 561 selects one of first feeder 601 and fourth feeder 604. Similarly, second selector 562 selects one of second feeder 602 and fifth feeder 605, and third selector 563 selects one of third feeder 603 and sixth feeder 606. Three selectors 561, 562, 563 perform the selecting operations based on settings from host control section 51. Selectors 561, 562, 563 may be configured to select any one of three or more feeders 6.

An operation of electronic component supply device 3A of the second embodiment will be described below. Hereinafter, the operation of electronic component supply device 3A will be described based on a case where six feeders 601, 602, 603, 604, 605, 606 are provided as target feeders for updating, and update software is transmitted in a single transmission. Host control section 51 receives a software updating command from control device 7 and starts an updating control of operation software 655 of feeders 6. Firstly, host control section 51 confirms that a data length of the update software is smaller than a memory capacity and can be transmitted in a single transmission and that six feeders 601, 602, 603, 604, 605, 606 constitute target feeders for updating.

Next, host control section 51 sets first selector 561 so as to select first feeder 601 and then writes update software and a communication start flag for first feeder 601 in first memory 531. Then, first communication function circuit 541 reads the communication start flag, further reads the update software for first feeder 601, and transmits the update software to first selector 561. As a result, the update software for first feeder 601 is properly transmitted to individual control section 65 of first feeder 601 byway of first selector 561.

Next, similarly, host control section 51 sets second selector 562 so as to select second feeder 602 and then writes update software and a communication start flag for second feeder 602 in second memory 532. Then, second communication function circuit 542 reads the communication start flag, further reads the update software for second feeder 602, and transmits the update software to second selector 562. As a result, the update software for second feeder 602 is properly transmitted to individual control section 65 of second feeder 602 by way of second selector 562.

Similarly, host control section 51 sets third selector 563 so as to select third feeder 603 and then writes in third memory 533 the update software and a communication start flag data for the third feeder 603. Then, third communication function circuit 543 reads the communication start flag, further reads the update software for third feeder 603, and transmits the update software to third selector 563. As a result, the update software for third feeder 603 is properly transmitted to individual control section 65 of third feeder 603 by way of third selector 563.

As a result of these transmissions, individual control sections 65 of first feeder 601, second feeder 602, and third feeder 603 replace at least each part of operation software 655 with the update software, being respectively received, to thereby update the operation software 655. When the updating is completed, each individual control section 65 transmits a reply to inform the completion of updating to each of communication function circuits 541, 542, 543. When receiving the replies informing the completion of updating, communication function circuits 541, 542, 543 write a communication completion flag data in memories 531, 532, 533, respectively.

Next, host control section 51 reads sequentially the contents of memories 531, 532, 533 and confirms the presence or absence of the communication completion flag. When confirming the communication completion flag of first memory 531, host control section 51 sets first selector 561 so as to select fourth feeder 604 and then writes update software and a communication start flag for fourth feeder 604 in first memory 531. Then, first communication function circuit 541 reads the communication start flag, further reads the update software for fourth feeder 604, and transmits the update software to first selector 561. As a result, the update software for fourth feeder 604 is properly transmitted to individual control section 65 of fourth feeder 604 byway of first selector 561.

Next, similarly, when confirming the communication completion flag of second memory 532, host control section 51 sets second selector 562 so as to select fifth feeder 605, and writes update software and a communication start flag for fifth feeder 605 in second memory 532. Then, second communication function circuit 542 reads the communication start flag, further reads the update software for fifth feeder 605, and transmits the update software to second selector 562. As a result, the update software for fifth feeder 605 is properly transmitted to individual control section 65 of fifth feeder 605 by way of second selector 562.

Similarly, when confirming the communication completion flag of third memory 533, host control section 51 sets third selector 563 so as to select sixth feeder 606 and then writes update software and a communication start flag for sixth feeder 606 in third memory 533. Then, third communication function circuit 543 reads the communication start flag, further reads the update software for sixth feeder 606, and transmits the update software to third selector 563. As a result, the update software for sixth feeder 606 is properly transmitted to individual control section 65 of sixth feeder 606 by way of third selector 563.

As a result of these transmissions, individual control sections 65 of fourth feeder 604, fifth feeder 605, and sixth feeder 606 replace at least each part of operation software 655 with the update software, being respectively received, to thereby update the operation software 655. When the updating is completed, each individual control section 65 transmits a reply to inform the completion of updating to each of communication function circuits 541, 542, 543. When receiving the replies informing the completion of updating, communication function circuits 541, 542, 543 write a communication completion flag data in memories 531, 532, 533, respectively.

Next, host control section 51 reads sequentially the contents of memories 531, 532, 533 and confirms the presence or absence of the communication completion flag. Host control section 51 recognizes that operation software 655 of six feeders 601, 602, 603, 604, 605, 606 has been updated completely at a point in time when host control section 51 confirms the three communication completion flags and informs control device 7 of the completion of updating.

Here, a total time of summing the setting time spent for setting selectors 561, 562, 563 by host control section 51 and the writing time spent for writing the update software and the communication start flags in memories 531, 532, 533 is significantly smaller than the transmission times of communication function circuits 541, 542, 543. Therefore, most portions of the first transmit time of three communication function circuits 541, 542, 543 overlap one another, and most portions of the second transmission time also overlap one another. On the other hand, in the comparison example, the update software needs to be transmitted sequentially to six feeders 601, 602, 603, 604, 605, 606, and a total transmission time necessary to complete the six transmissions is six times longer than the single transmission time. Therefore, in the second embodiment in which a total transmission time necessary to complete the transmission is only twice the single transmission time, the updating time is shortened to about 35 to 40% of the updating time of the comparison example.

The effect of shortening the updating time of operation software 655 depends on the number of feeders 6 handled by one set of information transmission section and selector. As an example, a case is assumed in which 65 slots 32 are provided. In this case, there are considered a first configuration example in which 13 sets of information transmission section and selector are provided, and each set handles five feeders 6 and a second configuration example in which five sets of information transmission section and selector are provided, and each set handles 13 feeders 6. With the first configuration example and the second configuration example, the updating time shortening effect and the circuit scale reduction effect can be made compatible with each other. Then, the first configuration example is superior to the second comparison example in relation to the updating time shortening effect, while the second comparison example is superior to the first comparison example in relation to the circuit scale reduction effect.

In the second embodiment, too, no limitation is imposed on the number of feeders 6 constituting target feeders for updating. When multiple feeders 6 constituting target feeders for updating are handled by a specific selector, the updating time shortening effect is not generated compared with the comparison example.

In electronic component supply device 3A of the second embodiment, the number of multiple information transmission sections 521, 522, 523 are fewer than that of multiple feeders 601, 602, 603, 604, 605, 606, and at least part of multiple information transmission sections 521, 522, 523 includes respective selector 561, 562, or 563 for switching to individual control section 65 of a target to which the update software is transmitted based on a command from host control section 51. According to this configuration, the effect of shortening the updating time of operation software 655 and the effect of reducing the circuit scale can be made compatible with each other.

(6. Application and Modification of Embodiments)

A hardware configuration for electrical connections of memory 531, 532, 533, software procedures for reading and writing data, communication specifications of communication function circuits 541, 542, 543, and the like can be modified as required. In the second embodiment, while selectors 561, 562, 563 perform the selecting operation according to the setting from host control section 51, there is another method. For example, a configuration may be adopted in which host control section 51 writes select commands in memories 531, 532, 533, and communication function circuits 541, 542, 543 that read the select commands set selectors 561, 562, 563. Other various applications and modifications can be made in the present disclosure.

DESCRIPTION OF REFERENCE SIGNS

1: Electronic component mounter; 3, 3A: Electronic component supply device; 31: Pallet member; 32: Slot; 3X: Electronic component supply device of comparison example; 51: Host control section; 521, 522, 523: First, second, third information transmission section; 531, 532, 533: First, second, third memory; 541, 542, 543: First, second, third communication function circuit; 55: Bus; 561, 562, 563: First, second, third selector; 6: Feeder; 601, 602, 603, 604, 605, 606: First, second, third, fourth, fifth, sixth feeder; 63: Sprocket; 64: Drive motor; 65: Individual control section; 655: Operation software; SW1, SW2, SW3: Update software.

The invention claimed is:

1. An electronic component supply device, comprising:
multiple feeders that are exchangeable with each other, each of the feeders including
a tape feeding mechanism configured to feed out a carrier tape, holding multiple electronic components, and
an individual control section including an individual processing unit configured to operate by use of operation software to control the tape feeding mechanism to thereby supply sequentially an electronic component to a respective feeding position;
a host control section including a host processing unit and is configured to hold update software to replace at least part of the operation software; and
multiple information transmission sections, being connected between the host control section and the individual control sections of the multiple feeders, so as to transmit information and configured to transmit the update software from the host control section to the individual control sections independently of one another,
wherein the host control section holds multiple types of the update software which differ from one another for multiple types of the multiple feeders installed in an exchangeable manner and the host control section updates the operation software of the individual control section based on which of the multiple types of feeders is installed into the electronic component supply device.

2. The electronic component supply device according to claim 1,
wherein each one of the multiple information transmission sections has a memory, in which the host control section processing unit writes the update software via a bus, and a communication function circuit configured to transmit the update software written in the memory to the individual control section.

3. The electronic component supply device according to claim 2,
wherein the host processing unit writes sequentially the update software in the respective memories of the multiple information transmission sections, and
wherein the respective communication function circuits of the multiple information transmission sections start transmission when the update software is written in the memories.

4. The electronic component supply device according to claim 1,
wherein the multiple information transmission sections are provided for the multiple feeders one for each feeder.

5. The electronic component supply device according to claim 1,
wherein the multiple information transmission sections are smaller in number than the multiple feeders, and
wherein at least part of the multiple information transmission sections has include a selector configured to switch the individual control sections to select the individual control section to be a target according to a command from the host control section.

6. The electronic component supply device according to claim 1,
wherein when the feeder of a first model type in the multiple types of the multiple feeders is installed, a first information transmission section of the multiple information transmission sections, which is connected to the feeder of the first model type, transmits first update software corresponding to the feeder of the first model type in the multiple types of update software.

7. The electronic component supply device according to claim 1,
wherein the update software is divided into multiple packets and is transmitted packet by packet in multiple times.

* * * * *